(12) United States Patent
Omori et al.

(10) Patent No.: US 9,110,384 B2
(45) Date of Patent: Aug. 18, 2015

(54) SCANNING ELECTRON MICROSCOPE

(75) Inventors: Seiko Omori, Delmar, NY (US);
Junichi Tanaka, Hachioji (JP);
Yoshinori Nakayama, Sayama (JP);
Keiichiro Hitomi, Delmar, NY (US)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 13/522,984

(22) PCT Filed: Jan. 21, 2011

(86) PCT No.: PCT/JP2011/000301
§ 371 (c)(1),
(2), (4) Date: Jul. 19, 2012

(87) PCT Pub. No.: WO2011/089913
PCT Pub. Date: Jul. 28, 2011

(65) Prior Publication Data
US 2012/0298865 A1    Nov. 29, 2012

(30) Foreign Application Priority Data
Jan. 25, 2010 (JP) .................... 2010-012747

(51) Int. Cl.
H01J 37/28 (2006.01)
G03F 7/26 (2006.01)
(Continued)

(52) U.S. Cl.
CPC ........... *G03F 7/70625* (2013.01); *H01J 37/222* (2013.01); *H01J 37/28* (2013.01);
(Continued)

(58) Field of Classification Search
CPC ....... H01J 37/26; H01J 37/261; H01J 37/265; H01J 37/28; H01J 2237/226; H01J 2237/24571; H01J 2237/2809; G01B 15/00; G01B 15/04; G03F 7/70625
USPC .................................. 250/306–311
See application file for complete search history.

(56) References Cited

U.S. PATENT DOCUMENTS

2004/0051040 A1    3/2004  Nasu et al.
2005/0247876 A1*  11/2005  Kawada et al. ............... 250/310
(Continued)

FOREIGN PATENT DOCUMENTS

JP    63-211472    9/1988
JP    4-96572    3/1992
(Continued)

*Primary Examiner* — Michael Logie
*Assistant Examiner* — David E Smith
(74) *Attorney, Agent, or Firm* — Baker Botts L.L.P.

(57) ABSTRACT

Disclosed is a scanning electron microscope provided with a calculation device (403) for measuring the dimension of a pattern on a sample (413), characterized in that the amount of change of a pattern shape, caused by electron beam irradiation, is calculated and stored, and a pattern shape contour (614; 815; 1512) before the sample is irradiated with an electron beam is restored from a pattern shape contour (613; 814; 1511) in a scanning electron microscope image (612; 813; 1510) after the sample is irradiated with an electron beam using the calculated amount and, then, the pattern shape contour (614; 815; 1512) is displayed. Thus, the shrinking of a resist and/or the effect of electrostatic charge caused when a sample is irradiated with an electron beam are eliminated, so that the shape contour of a two-dimensional pattern before irradiating an electron beam can be restored with a high degree of accuracy, and the dimension of a pattern can be measured with a high degree of accuracy, using the restored image.

8 Claims, 15 Drawing Sheets

(51) Int. Cl.
*G03F 7/20* (2006.01)
*H01J 37/22* (2006.01)

(52) U.S. Cl.
CPC .... *H01J2237/1536* (2013.01); *H01J 2237/226* (2013.01); *H01J 2237/24571* (2013.01); *H01J 2237/2809* (2013.01); *H01J 2237/2817* (2013.01)

(56) References Cited

U.S. PATENT DOCUMENTS

| | | | | |
|---|---|---|---|---|
| 2007/0192707 | A1* | 8/2007 | Maeda et al. | 715/744 |
| 2007/0192757 | A1* | 8/2007 | Emi et al. | 716/20 |
| 2008/0130982 | A1* | 6/2008 | Kitamura et al. | 382/144 |
| 2009/0197189 | A1* | 8/2009 | Ide et al. | 430/30 |
| 2009/0212212 | A1* | 8/2009 | Shishido et al. | 250/307 |
| 2009/0218491 | A1* | 9/2009 | Morokuma et al. | 250/310 |

FOREIGN PATENT DOCUMENTS

| | | |
|---|---|---|
| JP | 2004-264102 | 9/2004 |
| JP | 2005-327578 | 11/2005 |
| JP | 2005-338102 | 12/2005 |
| JP | 2007-3535 | 1/2007 |
| JP | 2007-299768 | 11/2007 |
| JP | 2008-177064 | 7/2008 |
| JP | 2009-135273 | 6/2009 |
| JP | 2009-198338 | 9/2009 |
| JP | 2009-222454 | 10/2009 |
| JP | 2011-220735 | 11/2011 |

* cited by examiner (A) ONE-DIMENSIONAL PATTERN (B) TWO-DIMENSIONAL PATTERN

SCANNING ELECTRON MICROSCOPE

TECHNICAL FIELD

The present invention relates to a scanning electron microscope.

BACKGROUND ART

In semiconductor fabricating steps, a pattern dimension of a semiconductor device is measured, and its finishing result is evaluated by using a charged particle beam apparatus of a scanning electron microscope (Scanning Electron Microscope, hereinafter, referred to as SEM) or the like. In particular, an SEM which measures a line width of a line pattern or a hole diameter of a hole pattern of a semiconductor is referred to as CD-SEM (Critical Dimension SEM).

In CD-SEM, an electron beam which is emitted from an electron gun that is installed upward from a wafer is focused to slenderize by a convergent lens, and is two-dimensionally scanned on a sample to be evaluated by a deflector. A secondary electron which is generated from a surface of the sample by irradiating the surface with the electron beam is caught by a secondary electron detector, and an obtained signal is recorded as an image (hereinafter, referred to as an SEM image). An amount of generating the secondary electron is changed by recesses and protrusions of the sample. Therefore, a change in a shape of the surface of the sample can be grasped by evaluating a secondary electron signal. An edge position is specified by using the fact that the secondary electron signal is rapidly increased at an edge position of a pattern, and a dimension is measured (hereinafter, referred to as length measurement). However, in a case where a resist material is measured by CD-SEM, there pose two problems which become obstacles. First, a photoresist for argon fluoride (ArF) excimer laser which is used as a photosensitive material of photolithography (hereinafter, referred to as ArF resist) is fragile at an electron beam and a volume thereof is reduced by an electron beam irradiation (hereinafter, referred to as shrinking).

Second, there occurs an electrostatic charge of a surface of a sample which is caused by irradiating an electron having a negative electric charge. The electrostatic charge of the surface of the sample by an electron beam irradiation can be represented by a secondary electron emission coefficient δ which is defined by (secondary electron amount/incident electron amount), and shows a characteristic as shown in FIG. 1. An irradiation energy is partitioned to three ranges (101, 102, 103) with an irradiation energy at which numbers of particles of incident electrons and secondary electrons coincide with each other, that is, an irradiation energy at which the second electron generating efficiency δ becomes 1 as a boundary. At ranges 101 and 103, the number of particles of the secondary electrons is smaller than the number of particles of the incident electrons, and the sample is electrically charged negatively. In contrast thereto, at range 102, the number of particles of secondary electrons is larger than the number of particles of incident electrons. Therefore, the sample is electrically charged positively. When the sample is electrically charged positively at several V, the secondary electron having an energy as small as several eV is pulled back to the surface of the sample, and also the incident electrons are deflected. As a result thereof, a brightness of an SEM image is darkened, a dimensional error by deflecting the incident electrons is brought about, and it seems that its influence is effected on the measurement.

Patent Literatures 1 and 2 disclose a method of FIG. 2 in order to presume a dimension before changing the dimension by shrinkage. A length of a dimension of a pattern which is shrunk by an electron beam irradiation is repeatedly measured, a result of the length measurement is plotted (201), and an approximate expression (202) is fitted to the plotting (201) of a corresponding length measurement value. Thereby, dimension before irradiating an electron beam, that is, a dimension (203) before having been shrunk is presumed. However, according to the method, no mention is given to an influence of an electrostatic charge, and the method is on the premise that a shrinking amount stays the same at all portions of a resist pattern which is an object.

Patent Literature 3 describes a technology of carrying out a highly reliable dimension measurement by extracting information of a contour based on an actual pattern edge end of a sample.

CITATION LIST

Patent Literatures

Patent Literature 1: Japanese Unexamined Patent Application Publication No. 2005-338102
Patent Literature 2: Japanese Unexamined Patent Application Publication No. 2007-003535
Patent Literature 3: Japanese Unexamined Patent Application Publication No. 2009-198338

SUMMARY OF INVENTION

Technical Problem

When there is a dispersion in a physical dimensional change by shrinkage, or a dimensional error by deflecting an incident electron caused by an electrostatic charge, a reliability of a dimension or a shape that is obtained from the SEM image is lowered, which becomes an obstacle in measuring with high accuracy. In order to realize high accuracy measurement without being effected with such an influence, it is necessary to rebuild a pattern dimension or a pattern shape contour before changing the SEM image by shrinkage or an electrostatic charge and use the rebuilt pattern shape contour as an evaluation result.

A semiconductor circuit to be measured has not only a simple linear shape but a complicated two-dimensional pattern including a curvature portion (301) or the like shown in FIG. 3. In such a two-dimensional pattern, it is known that a taper angle of a pattern differs in a area A (302) and in a area B (303) and a change in a shape is not uniform. Therefore, even when a shape contour before an electron beam irradiation of a two-dimensional pattern is rebuilt by the method disclosed in Patent Literatures 1 and 2, the method does not include a process of taking the fact that a dimension and a shape change amount differ by the taper angle into consideration. Therefore, it is conceivable that an error of the rebuilt shape contour is increased. Even in an OPC (Optical Proximity Correction) design of controlling a finishing shape by previously including a correction pattern in a design data of a photomask, it is necessary to rebuild a shape contour before an electron beam irradiation. A design of the OPC pattern is carried out based on a lithosimulator in which it is predicted how a photomask pattern which is subjected to an OPC processing is transcribed on a silicon wafer. In order to verify whether a circuit pattern as designed is created on a wafer, it is necessary to observe a resist pattern that is transcribed on the wafer. In order to carry out an OPC verification further accurately, it is important that a shape contour of an SEM image obtained from CD-SEM is based on an actual pattern edge end of a sample. According to Patent Literature 3, a cross sectional shape of a pattern is presumed by applying projected waveforms at respective points of a pattern edge of CD-SEM to a library which relates a cross sectional shape of a sample to an electron beam signal waveform, an edge end (for example, bottom end) of a desired definition in the presumed cross sectional shape is made to be an edge point. A range of the edge points is made to be a contour of a pattern. Therefore, a contour based on an actual pattern edge end of the sample is outputted. However, it seems that even when an OPC correction is carried out by using a shape contour after changing the shape by an electron beam irradiation, a design error is produced by an amount of a shape change amount. Therefore, there is needed information of a shape contour before an electron beam irradiation even in the OPC correction.

It is an object of the present invention to rebuild a shape contour of a two-dimensional pattern before an electron beam irradiation with high accuracy.

Solution to Problem

According to the present invention, there is provided a scanning electron microscope including an electron source, a convergent lens of converging an electron beam emitted from the electron source, a deflection coil of scanning the electron beam on a sample, a detector of detecting a secondary electron generated from the sample by irradiating the sample with the electron beam, and calculating means for calculating a contour of a pattern of a surface of the sample based on an output of the detector, in which the calculating means corrects a contour of the pattern changed by irradiating the sample with the electron beam in accordance with a shape of the pattern.

Further, there is provided the scanning electron microscope, further including displaying means for displaying the contour of the pattern after having been corrected.

Further, there is provided the scanning electron microscope, in which the shape of the pattern is a cross sectional shape of the pattern created at the sample.

Further, there is provided the scanning electron microscope, in which the shape of the pattern is a taper angle of a section of the pattern created at the sample.

Further, there is provided the scanning electron microscope, in which the pattern is a resist pattern created at the sample.

Further, there is provided the scanning electron microscope, in which the shape of the pattern is an angle of a pattern edge relative to a scanning direction of the electron beam, further including a corresponding diagram storing portion of storing a corresponding diagram of the angle of the pattern edge relative to the scanning direction of the electron beam and a size change amount of the pattern.

Further, there is provided the scanning electron microscope, in which the contour of the pattern before irradiating the sample with the electron beam is calculated by calculating respectively individual shape change amounts at specific portions of a two-dimensional pattern.

Further, there is provided the scanning electron microscope, in which the specific portions of the two-dimensional pattern are a curvature portion of the pattern, a front end portion of the pattern, and a portion having a different interval of the patterns contiguous to each other.

Further, there is provided the scanning electron microscope, further including a restoring calculation portion of calculating the shape change amount by irradiating the sample with the electron beam by using a taper angle of a section of the pattern, a size change amount of the pattern, and a corresponding diagram storing portion of storing a corresponding diagram of an angle of a pattern edge relative to a scanning direction of the electron beam and the size change amount of the pattern when a restoring parameter amount of the specific portion of the two-dimensional pattern is made to be the size change amount, in which the contour of the pattern before irradiating the sample with the electron beam is calculated based on the shape change amount calculated by the restoring calculation portion.

Further, there is provided the scanning electron microscope, further including a stress calculating portion of calculating a stress by which the specific portions of the pattern effect influences to each other, wherein a position before irradiating the sample with the electron beam is calculated by using the stress calculating portion.

Further, there is provided a scanning electron microscope including an electron source, a convergent lens of converging an electron beam emitted from the electron source, a deflection coil of scanning the electron beam on a sample, a detector of detecting a secondary electron generated from the sample by irradiating the sample with the electron beam, and calculating means for calculating a contour of a pattern of a surface of the sample based on an output of the detector, further comprising a shape storing portion of storing a shape parameter of the pattern of the sample observed previously, a corresponding diagram storing portion of storing a correspondence of the shape parameter and a size change amount by changing a dimension by irradiating the sample with the electron beam, and a restoring calculation portion of calculating a shape change amount by irradiating the sample with the electron beam from the shape storing portion and the corresponding diagram storing portion, in which the calculating means corrects the contour of the pattern before irradiating the sample with the electron beam based on the shape change amount calculated by the restoring calculation portion.

It is known that the shape change amounts caused by irradiating the sample with the electron beam at respective portions of the pattern depend considerably on the cross sectional shape of the resist pattern, and the smaller the taper angle, the larger the shape change amount caused by irradiating the sample with the electron beam. Hence, according to the present invention, there are proposed a method and an apparatus of creating and storing a taper angle map of a pattern section for acquiring an SEM image by being connected to a database of a pattern that is provided from information or the like of a detailed cross sectional shape of the pattern and an edge direction of a pattern relative to a scanning direction of an electron beam other than "a resist material, an exposure condition, a position in a wafer of a pattern, a distance to a contiguous other pattern, and a pattern dimension" shown in Patent Literatures 1 and 2, further, creating and storing a corresponding diagram of a taper angle and a size change amount by shrinkage, and a corresponding diagram of an angle of a pattern edge relative to a scanning direction of an electron beam and a size change amount of a pattern, calculating shape change amounts caused by irradiating a sample with the electron beam at respective portions of the pattern by combining the databases, and restoring a shape contour before irradiating the sample with the electron beam based on the change amount. Further, in a case of restoring a shape contour before irradiating a sample with an electron beam of a two-dimensional pattern, there are proposed a method and an apparatus of detecting a specific portion (curvature, line end, contiguousness, density or the like) in the two-dimensional pattern, correcting also a positional shift not only by the shape change amounts of the respective portions but by a stress by which the respective portions of the pattern effect influences to each other, and restoring a shape contour.

Advantageous Effects of Invention

A shape contour before an electron beam irradiation of a two-dimensional pattern can be rebuilt with high accuracy.

DESCRIPTION OF EMBODIMENTS

Figure 1:
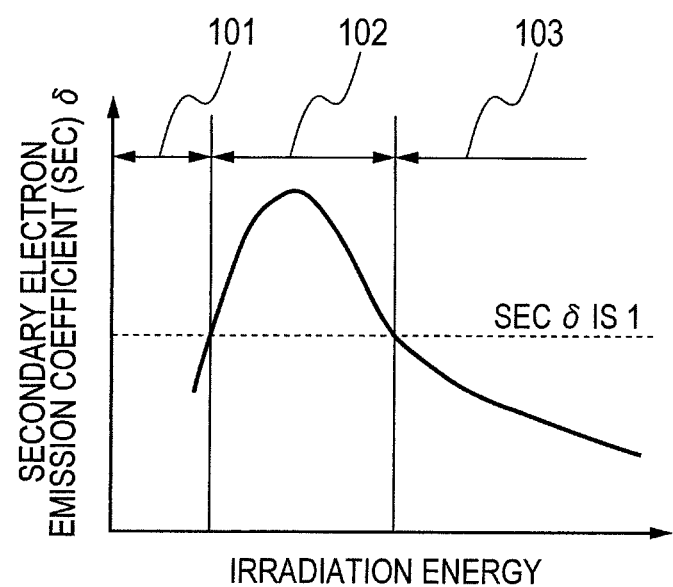
FIG. 1 is a diagram for explaining a secondary electron emission coefficient δ.
Figure 2:
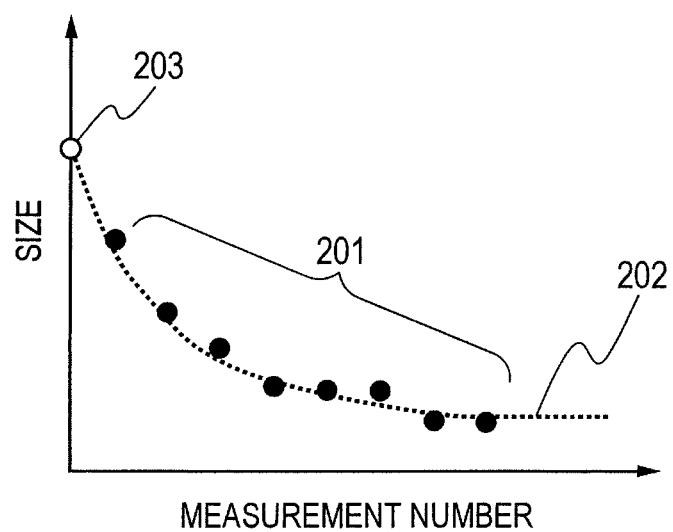
FIG. 2 is a diagram for explaining a method of Patent Literatures 1 and 2.
Figure 3:
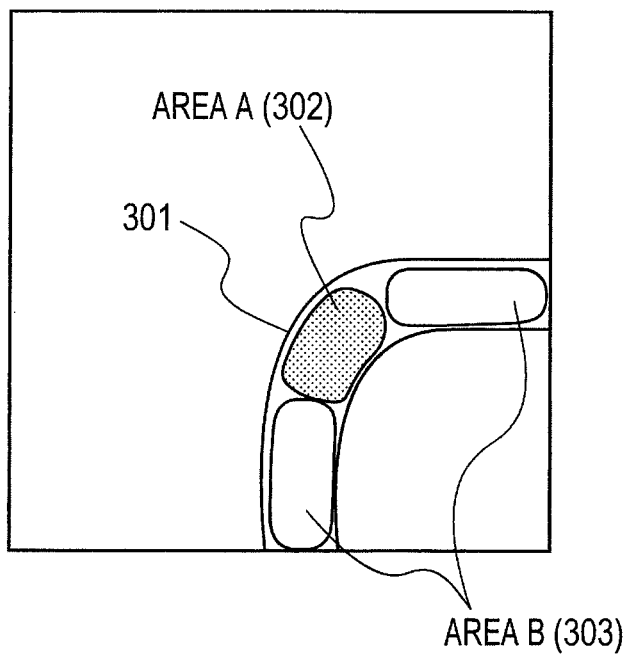
FIG. 3 shows a representative two-dimensional pattern.

An explanation will be given of embodiments of the present invention in reference to the drawings as follows. Incidentally, in the drawings for explaining the embodiments, a portion having the same function is attached with the same notation as a rule and a repeated explanation thereof will be omitted.

First Embodiment

Configuration of CD-SEM

Figure 4:
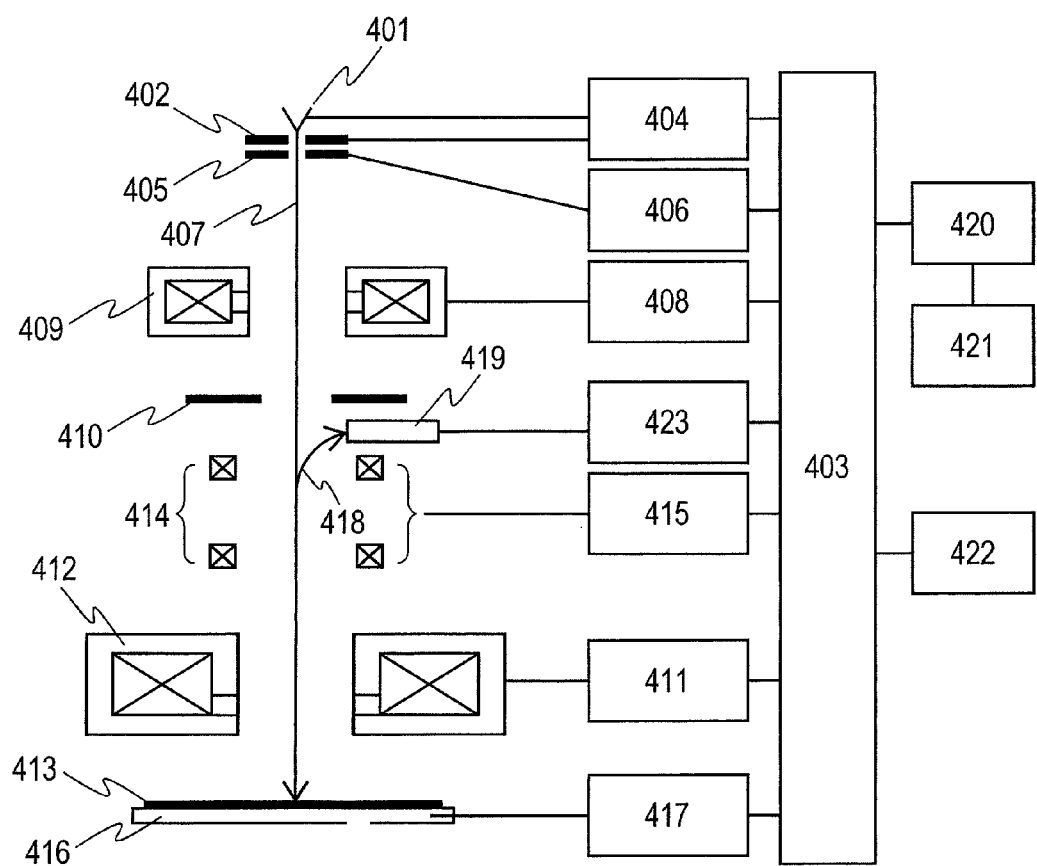
FIG. 4 shows a configuration of CD-SEM.

FIG. 4 is a diagram showing a configuration of a scanning electron microscope according to an embodiment of the present invention. A voltage is applied between a cathode 401 which is an electron source and a first anode 402 by a high voltage control power source 404 that is controlled by a controlling and operating unit 403 (control processor), and a prescribed emission current is drawn out from the cathode 401. An accelerating voltage is applied between the cathode 401 and a second anode 405 by a high voltage control power source 406 that is controlled by the controlling and operating unit 403. Therefore, an incident electron beam 407 that is emitted from the cathode 401 is accelerated and advances to a lens system at a later stage. The incident electron beam 407 is converged by a convergent lens 409 that is controlled by a convergent lens control power source 408, and an unnecessary area of the incident electron beam 407 is removed by a diaphragm plate 410. Thereafter, the incident electron beam 407 is converged as a small spot onto a sample 413 by an object lens 412 that is controlled by an object lens control power source 411, and is scanned two-dimensionally on the sample by a deflection coil 414. A scanning signal of the deflection coil 414 is controlled by a deflection coil control power source 415 in accordance with an observation magnification. The sample 413 is fixed onto a sample stage 416 that is movable two-dimensionally. The movement of the sample stage 416 is controlled by a stage control portion 417. A secondary electron 418 that is generated from the sample 413 by irradiation of the incident electron beam 407 is detected by a secondary electron detector 419. A drawing unit 420 displays an image in correspondence with a surface shape of the sample as a sample image on a sample image display unit 421 by converting a detected secondary electron signal into a visible signal and controlling the visible signal to pertinently align on another plane. An input unit 422 performs an interface between an operator and the controlling and operating unit 403. The operator not only controls the respective units described above via the input unit 422 but designates a length measuring point and commands dimension measurement. Incidentally, the controlling and operating unit 403 is provided with a storage unit not illustrated, and is made to able to store a length measuring value obtained, a length measuring sequence described below and so on.

A signal detected by the secondary electron detector 419 is amplified by a signal amplifier 423 and thereafter accumulated in an image memory at inside of the drawing unit 420. Incidentally, although the embodiment apparatus includes the secondary electron detector 419, the embodiment apparatus is not limited thereto but can include a reflecting electron detector for detecting a reflecting electron, or a detector for detecting light, an electromagnetic wave, or an X-ray in place of the secondary electron detector, or along therewith. An address signal in correspondence with a memory position of the image memory is generated at inside of the controlling and operating apparatus 403, or at inside of a separately installed computer, converted into an analog signal, and thereafter, supplied to the deflection coil 414. An address signal in X-direction is a digital signal repeating 0 through 512 in a case where an image memory consists of, for example, 512×512 pixels. An address signal in Y-direction is a digital signal repeating 0 through 512 which is plus 1 when the address signal in X-direction reaches 512 from 0. The digital signal is converted into the analog signal. An address of the image memory and an address of a deflection signal for scanning the electron beam are in correspondence with each other. Therefore, the image memory is recorded with a two-dimensional image of a deflection area of the electron beam by the scanning coil. Incidentally, the signal at inside of the image memory can be read successively time-sequentially by a reading address generating circuit which is synchronized with a reading clock. The signal which is read in correspondence with the address is converted into the analog signal and is made to be a brightness modulation signal of the sample image display unit 421. The image memory is provided with a function of superimposing (synthesizing) to store the image (image data) for improving S/N ratio. For example, one sheet of finished image is created by superimposing to store images that are obtained by 8 times of two-dimensional scanning. That is, a final image is created by synthesizing images that are created by one time or more of X-Y scanning unit(s). The number of images (frame integrating number) for creating one sheet of finished image can arbitrarily be set, and a proper value is set in view of a condition of the secondary electron emission coefficient δ or the like. An image which is intended to acquire finally can also be created by further superimposing plural sheets of images which are created by integrating plural numbers of sheets of images. An input of information to the image memory may be interrupted by executing blanking of the incident electron beam at a time point of storing a desired number of images or thereafter. In the following explanation of the embodiment, in order to perform one time of length measuring, the prescribed number of sheets of images (for example, 8 sheets of images) is integrated, and information for carrying out length measurement (for example, line profile) is extracted therefrom. That is, 8 sheets×number of times of length measurement of images are acquired in order to carry out a plural number of times of length measurement. Incidentally, although in explaining the present embodiment, an explanation will be given of an example of performing length measurement on the basis of creation of an image, the embodiment is not limited thereto but a line profile can also be created by scanning an electron beam, for example, one-dimensionally and on the basis of detection of secondary electrons or the like emitted from the scanning portion. Furthermore, there may be provided a sequence in which in a case of setting a frame integrating number to 8, when a 9-th sheet of image is inputted, a 1-th sheet of image is erased, and as a result, 8 sheets of images remain. Also, there can be carried out a weighted addition average in which when a 9-th sheet of image is inputted, an integrating image that is stored to the image memory is multiplied by ⅞, and the 9-th sheet of image is added thereto. The embodiment apparatus of the present invention is provided with a function of creating a line profile on the basis of a secondary electron or a reflecting electron or the like detected. A line profile is created on the basis of an amount of detecting electrons, or information of a brightness of a sample image or the like when an incident electron beam is scanned one-dimensionally or two-dimensionally. The obtained line profile is used for measuring a length of a pattern that is created on, for example, a semiconductor wafer. In measuring a length of a pattern, the sample image display unit 421 is made to display 2 pieces of vertical or horizontal cursor lines along with a sample image, 2 pieces of the cursors are placed at 2 portions of edges of the pattern by way of the input unit 422, and a length measuring value is calculated as a dimension value of the pattern by the controlling and operating unit 403 on the basis of an image magnification of the sample image and a distance between 2 pieces of cursors. Incidentally, although in explaining FIG. 4, the explanation has been given such that the control processor is integral with or in correspondence with the scanning electron microscope, the control processor is not naturally limited thereto but a control processor that is provided separately from the scanning electron microscope may perform a processing explained below. At that occasion, there are needed a transmission medium of transmitting a detection signal that is detected by the secondary electron detector 419 to the control processor, and transmitting a signal from the control processor to a lens or a deflector or the like of the scanning electron microscope, and input and output terminals of inputting and outputting a signal transmitted by way of the transmission medium. Also, a program of carrying out a processing explained below may be registered to a storage medium, and the program may be executed by a control processor having an image memory and supplying a signal necessary for the scanning electron microscope. Furthermore, the embodiment apparatus is provided with a function of storing a condition in observing plural points on, for example, a semiconductor wafer (portions to be measured, an optical condition of a scanning microscope or the like) previously as recipe, and performing measurement or observation in accordance with a content of the recipe. Also, a program of performing a processing explained below may be stored to a storage medium, and the program may be executed by a control processor having an image memory and supplying a signal which is necessary for a scanning microscope. That is, the embodiment of the present invention explained below is established as an invention of a program which can also be adopted to a charged particle beam apparatus of a scanning electron microscope or the like including an image processor.

(Processing Flow of Restoring Shape Contour Before Electron Beam Irradiation)

Figure 5:
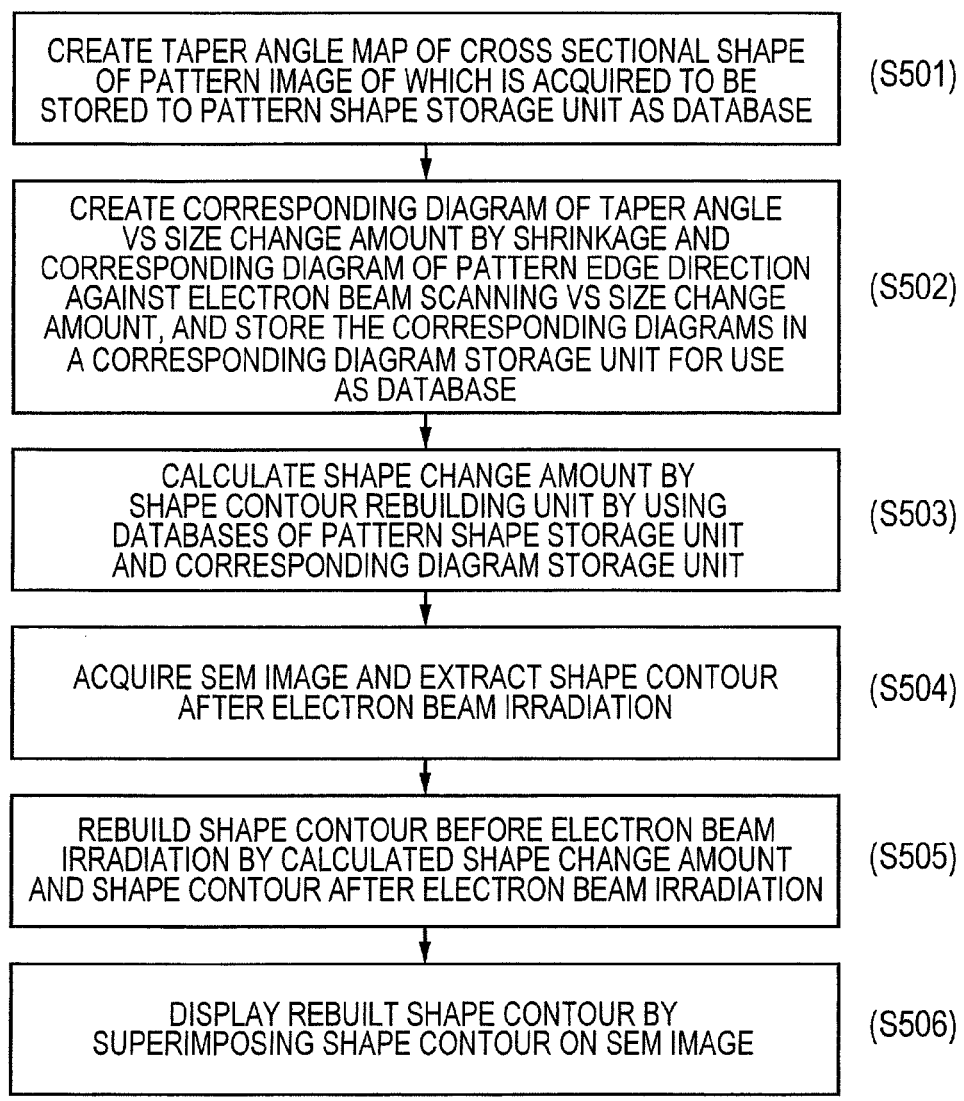
FIG. 5 is a processing flow of restoring a shape contour before irradiating a sample with an electron beam.
Figure 6:
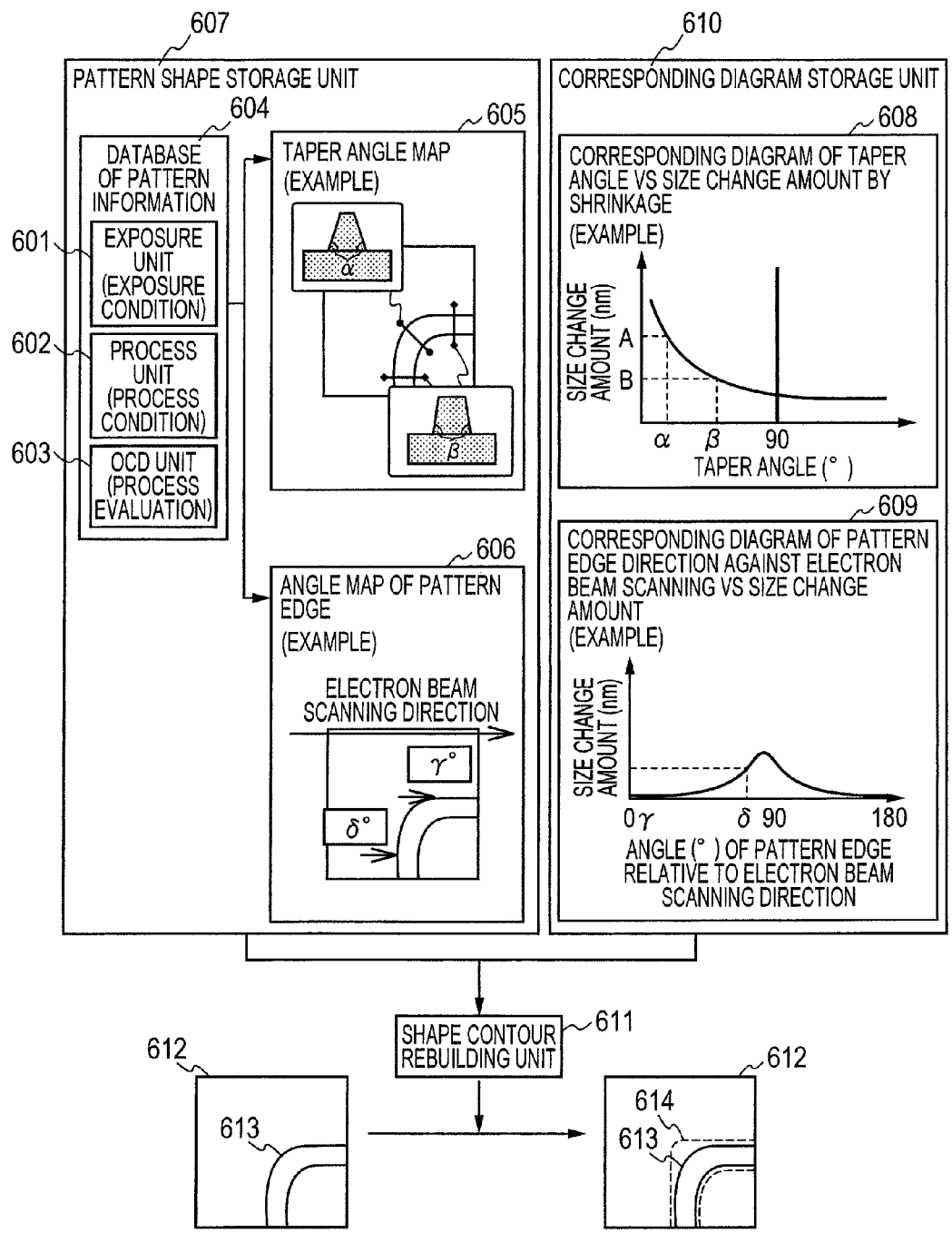
FIG. 6 is a supplementary diagram of the processing flow of restoring the shape contour before irradiating the sample with the electron beam.

According to the present invention, a function of the controlling and operating unit 403 of CD-SEM explained in reference to FIG. 4 is added with a calculation portion of restoring a shape contour before electron beam irradiation from an SEM image after electron beam irradiation. An operator superimposes a rebuilt shape contour on the acquired SEM image to display on the sample image display unit 421 by way of the input unit 422. An explanation will be given of a specific processing procedure in reference to FIG. 5 and FIG. 6. First, a taper angle map (605) of a cross sectional shape of a pattern that is acquired by CD-SEM, and an angle map (606) of a pattern edge relative to a scanning direction of an electron beam are stored to a pattern shape storage unit (607) as a database by being connected to a database of pattern information (604) such as an exposure condition (601) of an exposure unit, a process condition (602) of a process unit, and a result of process evaluation (603) of an OCD unit (S501). Next, a corresponding diagram of a taper angle and a size change amount by shrinkage (608) and a corresponding diagram of an angle of a pattern edge relative to a scanning direction of an electron beam and a size change amount (609) are created separately, and are stored to a corresponding diagram storage unit (610) as databases (S502). A description will be given later of a specific method of creating the respective corresponding diagrams, and a procedure of restoring a shape contour in a case of using the respective corresponding diagrams. There is calculated shape change amounts caused by electron beam irradiation at respective portions of a pattern at a shape contour rebuilding unit (611) by using the respective databases of the pattern shape storage unit (607) and the corresponding table storage portion (610) (S503). Next, an SEM image (612) is acquired by CD-SEM, and a shape contour (613) after electron beam irradiation is extracted from the acquired SEM image (611) (S504). A shape contour (614) before electron beam irradiation is rebuilt from the shape change amount caused by electron beam irradiation calculated by the shape contour rebuilding unit (611) and the shape contour portion (613) after electron beam irradiation (S505), and superimposed on the acquired SEM image (612) to display (S506).

With regard to the shape contour, a technology of extracting a contour from the pattern edge is used. Specifically, the pattern edge is extracted from the acquired SEM image, and pattern matching is carried out by the edge portion and a contour of design data. Next, a contour is created with regard to an SEM edge. In creating the contour, the contour is extracted by recognizing a brightness distribution of a white band of the SEM edge as a waveform, and connecting together portions having large brightness (or, portions which are extracted by setting a prescribed threshold).

(Method of Creating Respective Corresponding Diagrams of Corresponding Table Storage Portion and Restoring Shape Contour)

Figure 7:
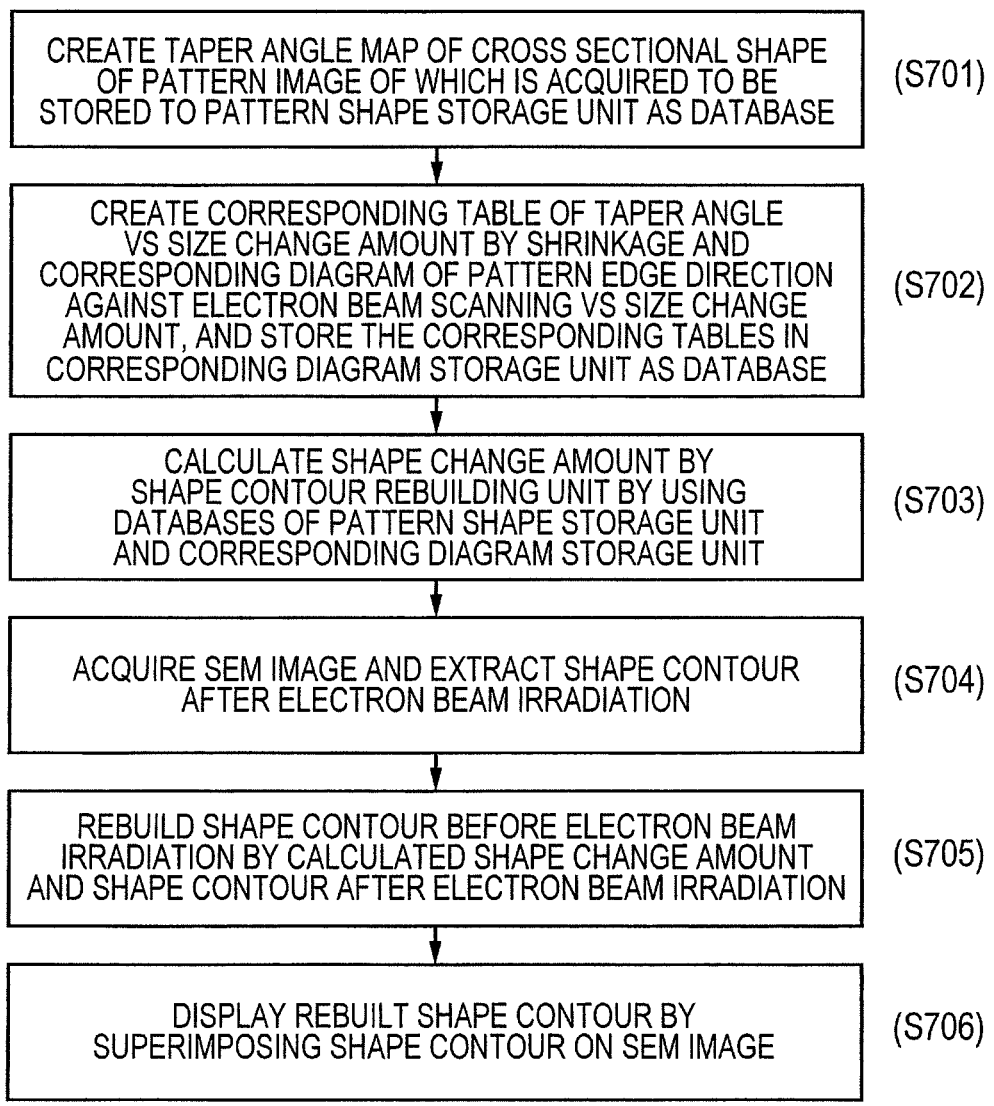
FIG. 7 shows a specific example of the processing flow of restoring the shape contour line before irradiating the sample with the electron beam.
Figure 8:
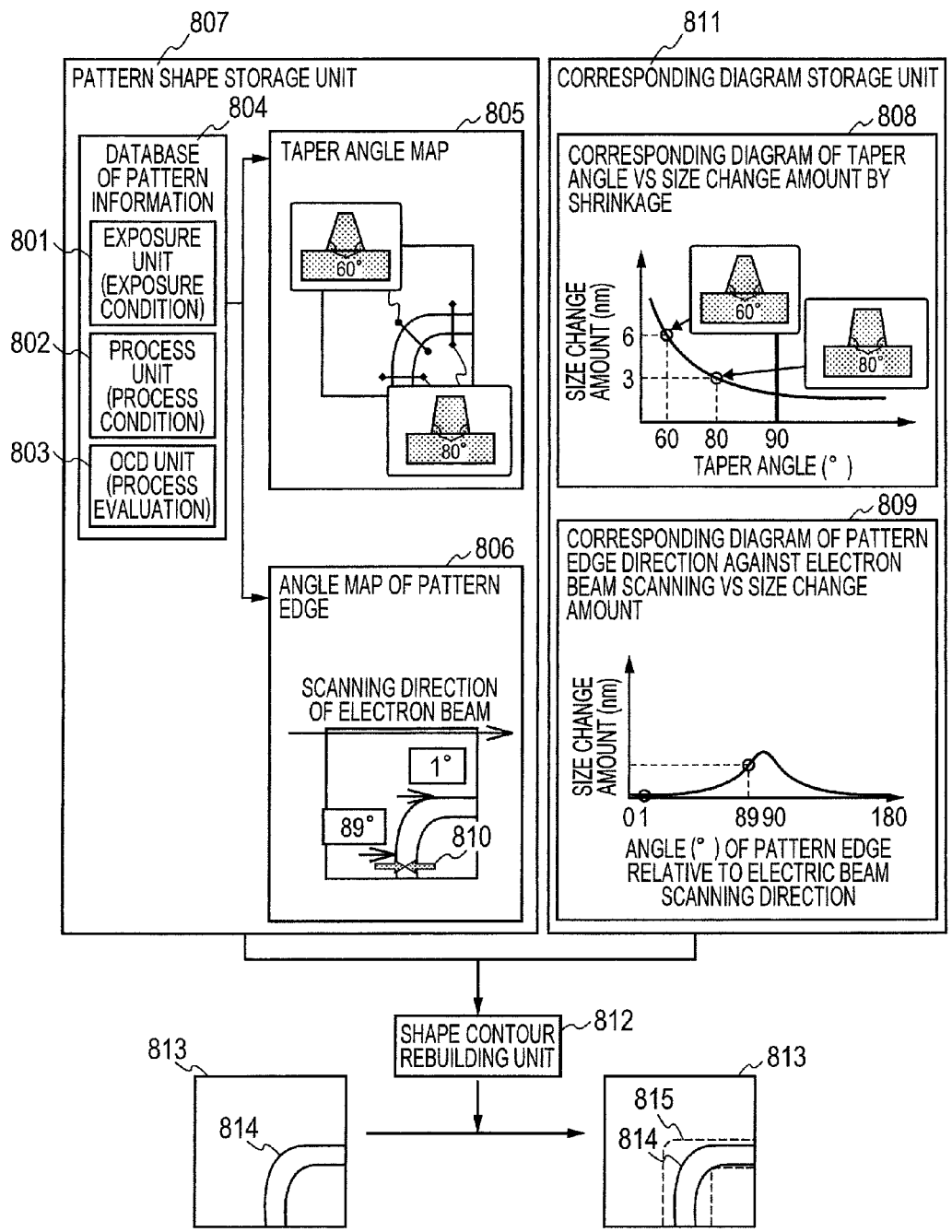
FIG. 8 is a supplementary diagram of the specific example of the processing flow of restoring the shape contour before irradiating the sample with the electron beam.

An explanation will be given of a specific processing procedure in reference to FIG. 7 and FIG. 8. First, a taper angle map (805) of a cross sectional shape of a pattern that is acquired by CD-SEM, and an angle map (806) of a pattern edge relative to a scanning direction of an electron beam are stored to a pattern shape storage unit (807) as a database by being connected to a database (804) of pattern information such as an exposure condition of an exposure unit (801), a process condition of a process unit (802), and a result of process evaluation of an OCD device (803) (S701). Next, a corresponding diagram of a taper angle and a size change amount by shrinkage (808), and a corresponding diagram of an angle of a pattern edge relative to a scanning direction of an electron beam and a size change amount (809) are separately created, and stored to a corresponding diagram storage unit (810) as a database (S702). In order to create the corresponding diagram of the taper angle and the size change amount by shrinkage (808), it is necessary that with regard to resist patterns of various taper angles, cross sectional shapes before electron beam irradiation and cross sectional shapes after having been shrunk by electron beam irradiation are measured, and size change amounts which are changed at a several nanometers level are specified. Section SEM or STEM may be used for specifying the size change amounts of the respective cross sectional shapes. In an ArF resist that is used in the present embodiment, a characteristic as in 708 is obtained for a relationship between a taper angle and a size change amount by shrinkage. The smaller the taper angle, the larger the size change amount by shrinkage such that the size change amount at the taper angle of 80° is about 3 nm whereas the size change amount at the taper angle of 60° is about 6 nm. Further, the size change amount is saturated at the size change amount of 90° or more.

Next, in order to create the corresponding diagram (809) of the angle of the pattern edge relative to the scanning direction of the electron beam and the size change amount, it is necessary to specify the angle of the pattern edge relative to the scanning direction of the electron beam and an amount of deflecting the electron beam by an electrostatic charge. In ArF resist used in the present embodiment, a characteristic as shown in 809 is obtained in the relationship between the angle of the pattern edge relative to the scanning direction of the electron beam and the size change amount. In a case where the angle of the pattern edge relative to the scanning direction of the electron beam is 1°, the electron beam does not undergo an influence of electrostatic charge considerably, and a dimensional error becomes zero. On the other hand, in a case where the angle of the pattern edge relative to the scanning direction of the electron beam is 89°, the electron beam undergoes the influence of the electrostatic charge in a left and right direction and is deflected in a direction indicated by a block arrow mark (810), and the dimensional error becomes +1 nm.

The shape change amounts caused by electron beam irradiation at respective portions of the pattern are calculated by the shape contour rebuilding unit (812) by using the respective databases of the pattern shape storage unit (807) and the corresponding diagram storage unit (812) (S703). Next, the SEM image (813) is acquired by CD-SEM, and the shape contour (814) after electron beam irradiation is extracted from the acquired SEM image (813) (S704). The shape contour line (815) before electron beam irradiation is rebuilt from the shape change amount caused by electron beam irradiation that is calculated by the shape contour storing calculation portion (812) and the shape contour (814) after electron beam irradiation (S705), and is superimposed on the acquired SEM image (813) to display (S706).

Second Embodiment

Correction of Position of Two-Dimensional Pattern

Figure 9:
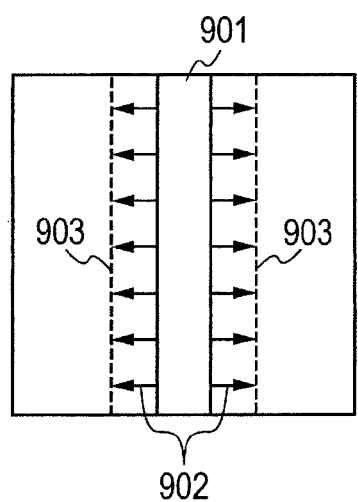
FIGS. 9(A) and 9(B) show a comparison of correcting positions of a one-dimensional pattern and a two-dimensional pattern.
Figure 9:
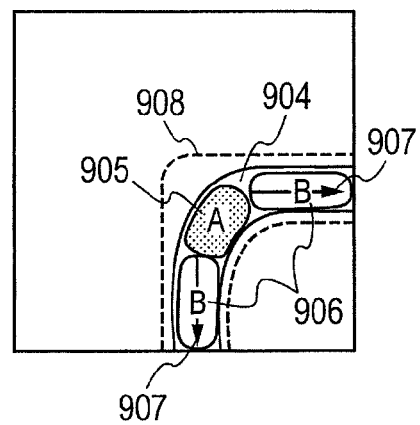

A behavior of a shape change in an electron beam irradiation differs in a one-dimensional pattern and a two-dimensional pattern. In a one-dimensional pattern (901) as shown in FIG. 9-(A), it seems that not only shape change amounts (902) at respective portions of the pattern but a force of pulling respective portions of the pattern to each other (hereinafter referred to as stress) is to the same degree. Therefore, when a shape contour (903) before electron beam irradiation is presumed, it is not necessary to correct a pattern position but a shape change amount that is simply calculated may be added. On the other hand, in a two-dimensional pattern (902) as shown in FIG. 9-(B), a shape change amount differs in area A (905) and area B (906). Also, a stress (907) as shown by an arrow mark is applied to area A by shrinkage area B. Therefore, in order to rebuild a shape contour (908) before electron beam irradiation of the two-dimensional pattern (904) with high accuracy, it is necessary to carryout correction of position in consideration of the stresses (907) between the respective portions of the pattern in addition to calculating shape change amounts at respective portions of the pattern.

Figure 10:
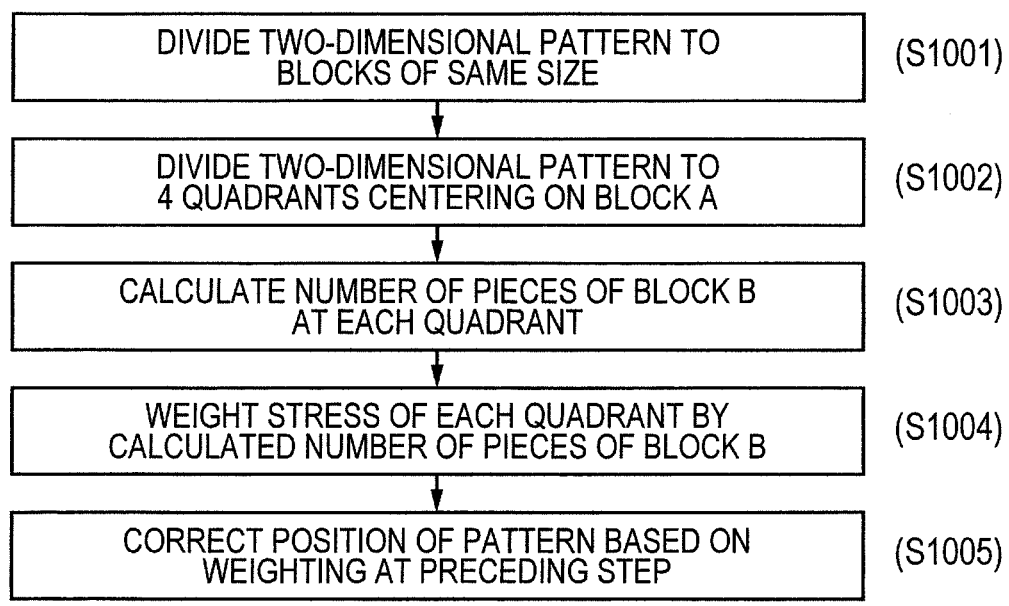
FIG. 10 is a processing flow of correcting a position in a two-dimensional pattern.
Figure 11:
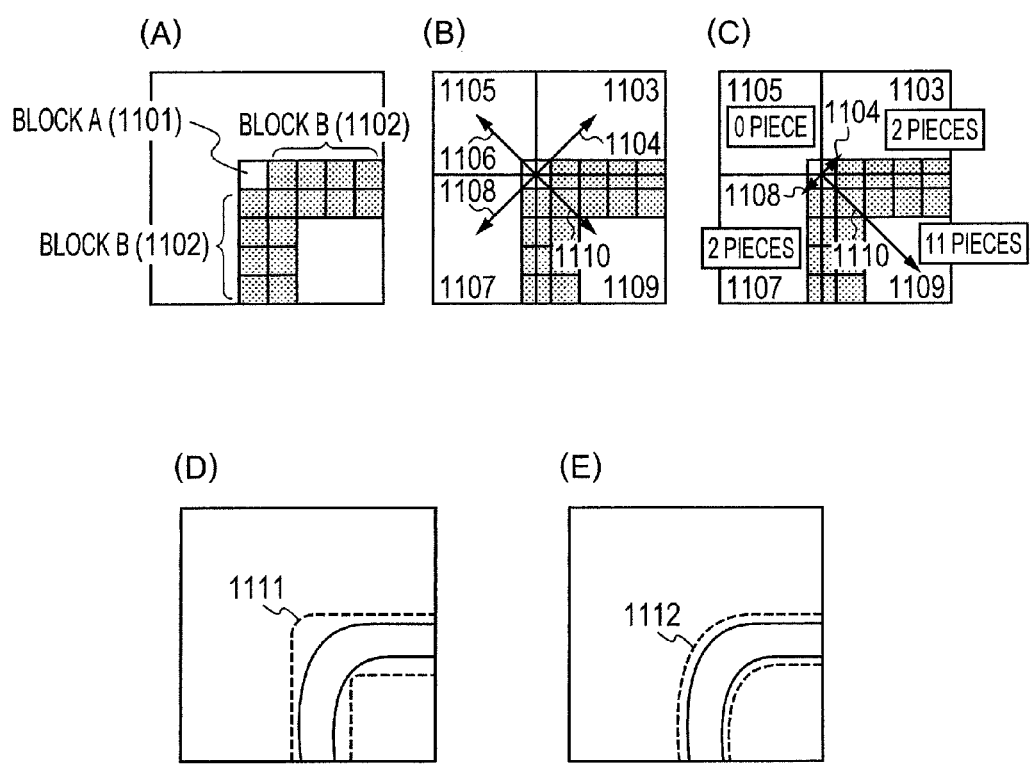
FIGS. 11(A), 11(B), 11(C), 11(D), and 11(E) show supplementary diagrams of the processing flow of correcting the position of the two-dimensional pattern.

An explanation will be given of a specific method of correcting a position of a two-dimensional pattern in reference to FIG. 10 and FIGS. 11-(A), 11-(B), 11-(C), 11-(D) and 11-(E). First, as shown in FIG. 11-(A), a two-dimensional pattern is divided to blocks of the same size (S1001). Incidentally, according to the present embodiment, an explanation will be given especially of a method of correcting a position of block A (1101). Surrounding blocks other than block A (1101) are made to be blocks B (1102). Next, as shown in FIG. 11-(B), the two-dimensional pattern is divided into 4 quadrants centering on block A (1101) (S1002). It is assumed that a stress is applied in a direction of an arrow mark (1104) in the first quadrant (1103), in a direction of an arrow mark (1106) in the second quadrant (1105), in a direction of an arrow mark (1108) in the third quadrant (1107), and in a direction of an arrow mark (1110) in the fourth quadrant (1109). Next, the number of blocks B (1102) included in each quadrant is calculated (S1003). The stress at each quadrant is weighted by a calculated number of pieces of blocks B (1102) (S1004), and the position is corrected based on the weighting (S1005). In a case of pattern of FIG. 11, as shown in FIG. 11-(C), the number of pieces of blocks B (1102) included in each quadrant is the largest in the fourth quadrant (1109) such that 0 piece in the second quadrant (1105), 2 pieces respectively in the first quadrant (1103) and the third quadrant (1107), and 11 pieces in the fourth quadrant (1109), and the stress applied in the direction of the arrow mark (1110) is the largest. Stresses are operated in directions inverse to each other in the arrow mark (1104) and the arrowmark (1108), and therefore, the forces may be regarded to be canceled by each other. When a shape contour (1111) before electron beam irradiation of the two-dimensional pattern as shown in the drawing is rebuilt based on the above-described, the shape contour (1111) is as shown by FIG. 11-(D), and it is known that the shape contour (1111) differs significantly from a shape contour (1112) which is rebuilt by a background art shown in FIG. 11-(E).

(Method of Restoring Shape Contour at Specific Portion of Two-Dimensional Pattern)

Figure 12:
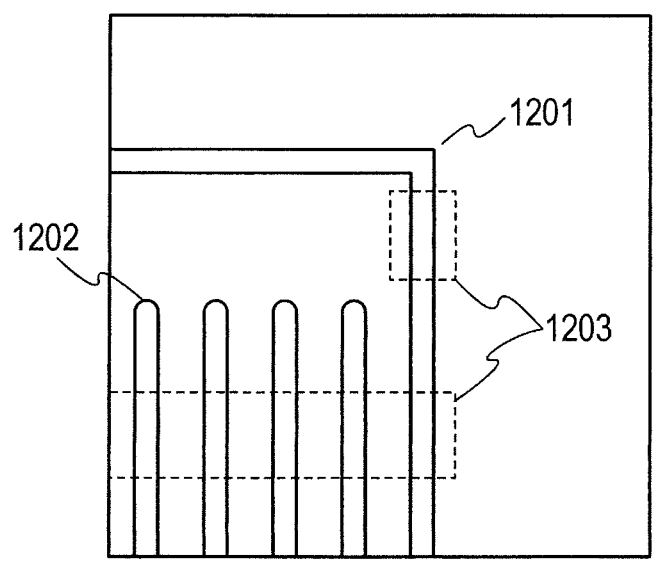
FIG. 12 is a diagram for explaining a specific portion of a two-dimensional pattern.
Figure 13:
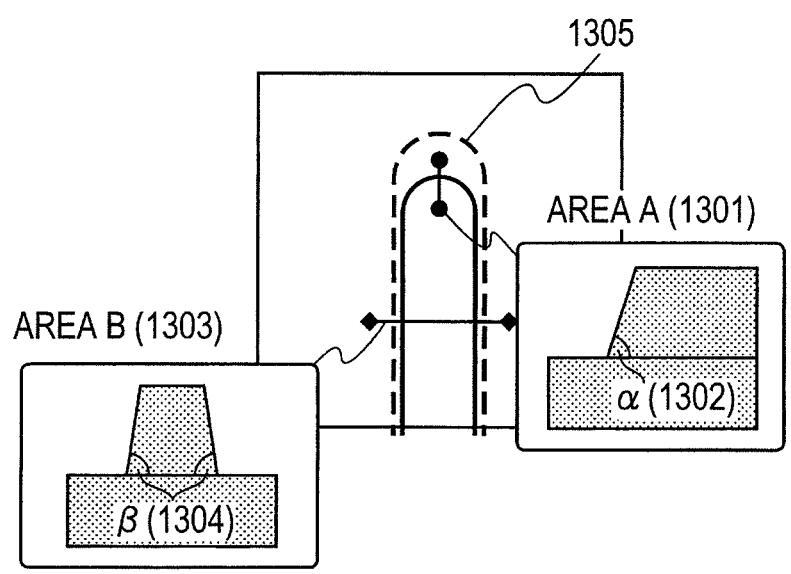
FIG. 13 shows a method of restoring a shape contour at a front end portion of a line pattern.

A two-dimensional pattern to be observed frequently includes a curvature portion (1201), a front end portion of a line pattern (1202), and a different pattern density portion (1203) as shown in FIG. 12. With regard to the curvature portion (1201), a shape contour before electron beam irradiation is rebuilt by using the method shown in the embodiment described above. Therefore, a description will not be given of the restoring method. An explanation will be given of a method of restoring a shape contour before electron beam irradiation of the front end portion of the line pattern (1202) in reference to FIG. 13.

Figure 14:
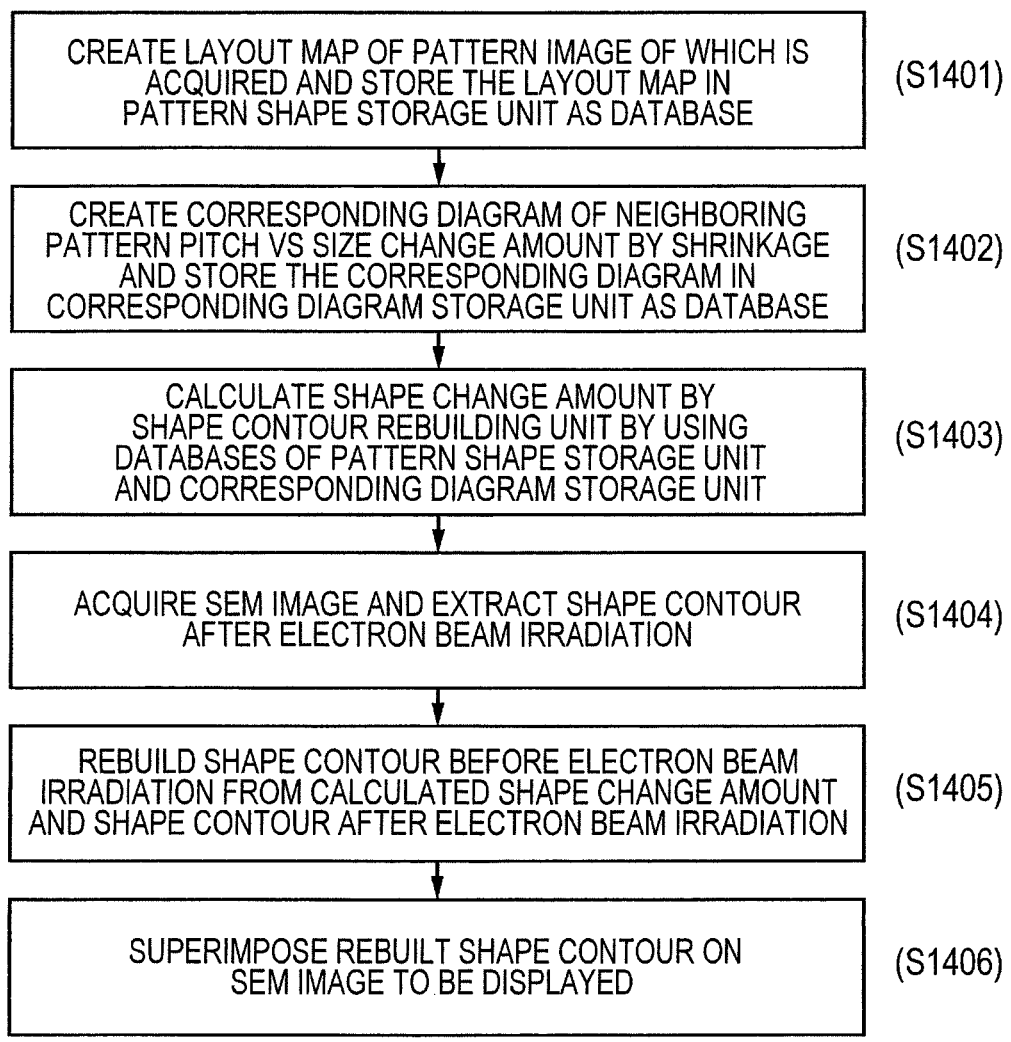
FIG. 14 is a processing flow of restoring a shape contour in a case where an neighboring pattern pitch is made to be a shape parameter.
Figure 15:
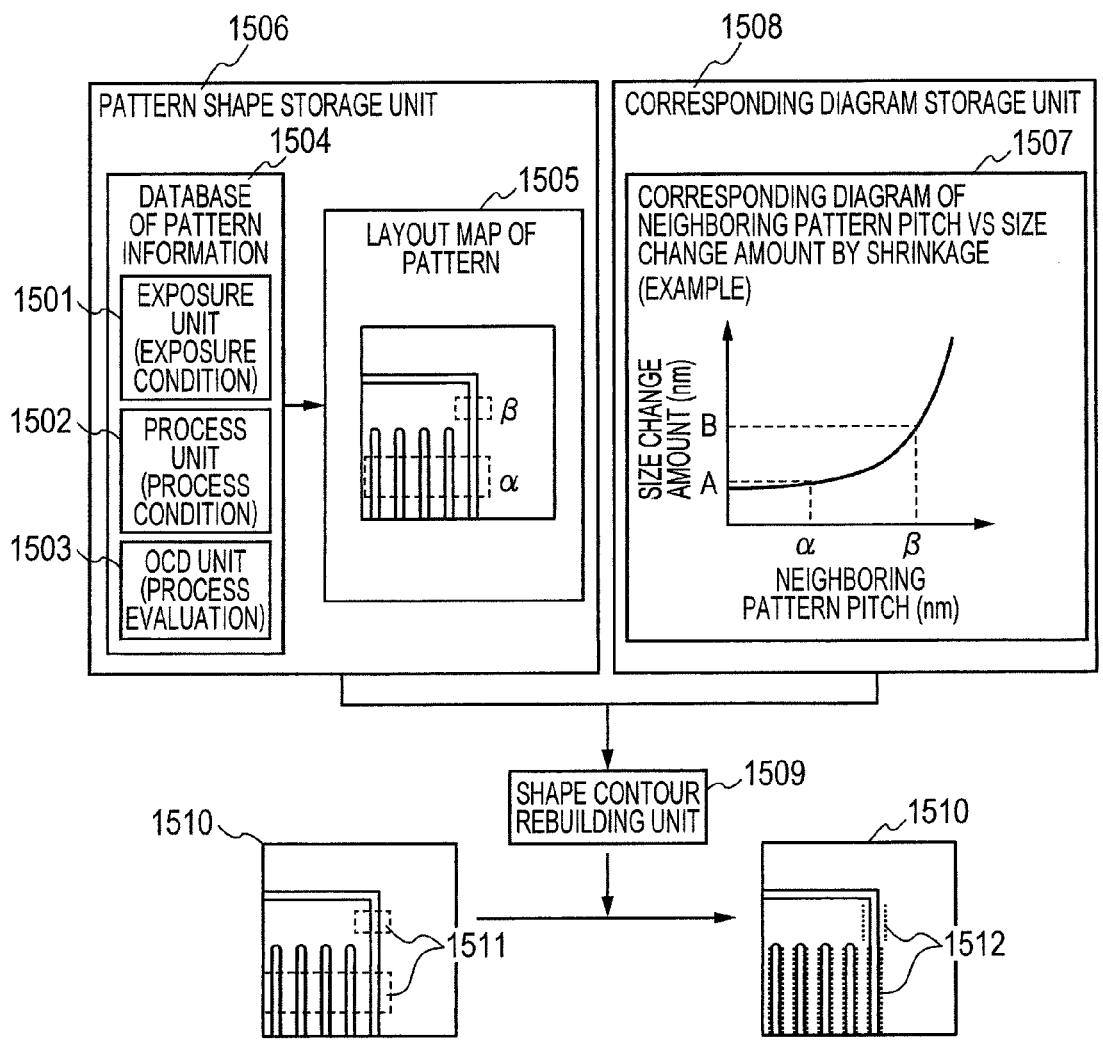
FIG. 15 is a supplementary diagram of the processing flow of restoring the shape contour in the case where the interval of the contiguous patterns is made to be the shape parameter.

A taper angle α (1302) of area A (1301) including the front end portion of the line pattern (1202) is smaller than a taper angle β (1304) of area B (1303). Therefore, a size change amount by electron beam irradiation is larger in area A than in area B. Based on the result, a shape contour (1305) before electron beam irradiation is configured by a shape indicated by a broken line. An explanation will be given of a specific processing procedure of a method of restoring a shape contour before electron beam irradiation of the different pattern density portion (1203) in reference to FIG. 14 and FIG. 15. First, a layout map of a pattern (1505) acquired by CD-SEM is stored to a pattern shape storage unit (1506) as a database by being connected to a database (1504) of pattern information such as an exposure condition of an exposure unit (1501), a process condition of a process unit (1502), and a process evaluation result of an OCD unit (1503) (S1401). Next, a corresponding diagram of an neighboring pattern pitch vs a size change amount by shrinkage (1507) is separately created and stored to a corresponding table storage portion (1508) as a database (S1402). In order to create the corresponding table (1507), it is necessary to specify a size change amount which is changed at a several nanometers level by measuring a cross sectional shape before electron beam irradiation and a cross sectional shape after having being shrunk by electron beam irradiation with regard to resist patterns in which intervals of contiguous patterns differ from each other. Section SEM or STEM may be used for specifying the size change amount. Shape change amounts caused by electron beam irradiation are calculated for respective intervals of contiguous patterns by a shape contour rebuilding unit (1509) by using the databases of the pattern shape storage unit (1506) and the corresponding table storage portion (1508) (S1403). Next, an SEM image (1510) is acquired by CD-SEM, and a shape contour (1511) after electron beam irradiation is extracted from the acquired SEM image (1510) (S1404). A shape contour (1512) before electron beam irradiation is rebuilt from the shape change amount caused by electron beam irradiation that is calculated by the shape contour rebuilding unit (1509) and the shape contour (1511) after electron beam irradiation (S1405), and is superimposed on the acquired SEM image (1510) to be displayed (S1406).

LIST OF REFERENCE SIGNS

101: range in which secondary electron emission coefficient is smaller than 1, 102: range in which secondary electron emission coefficient is larger than 1, 103: range in which secondary electron emission coefficient is smaller than 1, 201: plotting of repeatedly length measuring result, 202: approximate expression, 203: dimension before having been shrunk, 301: two-dimensional pattern, 302: area A, 303: area B, 401: cathode, 402: first anode, 403: controlling and operating unit, 404: high voltage control power source, 405: second anode, 406: high voltage control power source, 407: incident electron beam, 408: convergent lens control power source, 409: convergent lens, 410: diaphragm plate, 411: object lens control power source, 412: object lens, 413: sample, 414: deflection coil, 415: deflection coil control power source, 416: sample stage, 417: stage control unit, 418: secondary electron, 419: secondary electron detector, 420: drawing unit, 421: sample image display unit, 422: input unit, 423: signal amplifier, S501-S506: procedure of restoring shape contour, 601: exposure condition of exposure unit, 602: process condition of process unit, 603: process evaluation result of OCD unit, 604: database of pattern information, 605: taper angle map of cross sectional shape of pattern acquired by CD-SEM, 606: angle map of pattern edge, 607: pattern shape storage unit, 608: corresponding diagram of taper angle—size change amount by shrinkage, 609: corresponding diagram of angle of pattern edge against electron beam scanning—size change amount, 610: corresponding diagram storage unit, 611: shape contour storing calculation portion, 612: acquired SEM image, 613: shape contour line after electron beam irradiation extracted from acquired SEM image, 614: shape contour before electron beam irradiation, S701-S706: procedure of restoring shape contour, 801: exposure condition of exposure unit, 802: process condition of process unit, 803: process evaluation result of OCD unit, 804: database of pattern information, 805: taper angle map of cross sectional shape of pattern acquired by CD-SEM, 806: angle map of pattern edge, 807: pattern shape storage unit, 808: corresponding diagram of taper angle—size change amount by shrinkage, 809: corresponding diagram of angle of pattern edge against electron beam scanning—size change amount, 810: direction of deflecting electron beam, 811: corresponding diagram storage unit, 812: shape contour rebuilding unit, 813: acquired SEM image, 814: shape contour after electron beam irradiation extracted from acquired SEM image, 815: shape contour before electron beam irradiation, 901: one-dimensional pattern, 902: shape change tendency of one-dimensional pattern, 903: shape contour before electron beam irradiation of one-dimensional pattern, 904: two-dimensional pattern, 905: area A, 906: area B, 907: direction of pulling area A by shrinkage area B, 908: shape contour before electron beam irradiation of two-dimensional pattern, S1001-S1005: procedure of correcting position of two-dimensional pattern, 1101: block A, 1102: block B, 1103: first quadrant, 1104: direction of stress of first quadrant, 1105: second quadrant, 1106: direction of stress of second quadrant, 1107: third quadrant, 1108: direction of stress of third quadrant, 1109: fourth quadrant, 1110: direction of stress of fourth quadrant, 1111: shape contour before electron beam irradiation of two-dimensional pattern rebuilt by correcting position, 1112: shape contour before electron beam irradiation of two-dimensional pattern rebuilt by background art, 1201: curvature portion in two-dimensional pattern, 1202: front end portion of two-dimensional pattern, 1203: portion of different neighboring pattern pitch, 1303: area A, 1302: taper angle α, 1303: area B, 1304: taper angle β, 1305: shape contour before electron beam irradiation, S1401-S1406: procedure of restoring shape contour, 1501: exposure condition of exposure unit, 1502: process condition of process unit, 1503: process evaluation result of OCD unit, 1504: database of pattern information, 1505: layout map of pattern acquired by CD-SEM, 1506: pattern shape storage unit, 1507: corresponding diagram of neighboring pattern pitch vs size change amount by shrinkage, 1508: corresponding diagram storage unit, 1509: shape contour rebuilding unit, 1510: acquired SEM image, 1511: shape contour after electron beam irradiation extracted from acquired SEM image, 1512: shape contour before electron beam irradiation.

The invention claimed is:

1. A scanning electron microscope comprising:
an electron source;
a convergent lens of converging an electron beam emitted from the electron source;
a deflection coil of scanning the electron beam on a sample;
a detector of detecting a secondary electron generated from the sample by irradiating the sample with the electron beam; and
calculating means for calculating a contour of a pattern of a surface of the sample based on an output of the detector;
wherein the calculating means corrects a contour of the pattern changed by irradiating the sample with the electron beam in accordance with a shape of the pattern,
wherein the shape of the pattern is an angle of a pattern edge relative to a scanning direction of the electron beam, further comprising:
a corresponding diagram storing portion of storing a corresponding diagram of the angle of the pattern edge relative to the scanning direction of the electron beam and a size change amount of the pattern.

2. A scanning electron microscope comprising:
an electron source;
a convergent lens of converging an electron beam emitted from the electron source;
a deflection coil of scanning the electron beam on a sample;
a detector of detecting a secondary electron generated from the sample by irradiating the sample with the electron beam; and
calculating means for calculating a contour of a pattern of a surface of the sample based on an output of the detector;
a stress calculating portion of calculating a stress by which a specific portions of the pattern effect influences to each other,
wherein the calculating means corrects a contour of the pattern changed by irradiating the sample with the electron beam in accordance with a shape of the pattern and calculates by using the stress calculating portion,
wherein the shape of the pattern is a cross sectional shape of the pattern or a taper angle of a section of the pattern created at the sample, or a taper angle of a section of the pattern created at the sample, or a resist pattern created at the samples.

3. A scanning electron microscope comprising:
an electron source;
a convergent lens of converging an electron beam emitted from the electron source;
a deflection coil of scanning the electron beam on a sample;
a detector of detecting a secondary electron generated from the sample by irradiating the sample with the electron beam;
calculating means for calculating a contour of a pattern of a surface of the sample based on an output of the detector; and
a restoring calculation portion of calculating the shape change amount by irradiating the sample with the electron beam by using a taper angle of a section of the pattern, a size change amount of the pattern, and a corresponding diagram storing portion of storing a corresponding diagram of an angle of a pattern edge relative to a scanning direction of the electron beam and the size change amount of the pattern when a restoring parameter amount of the specific portion of the two-dimensional pattern is made to be the size change amount,
wherein the calculating means corrects a contour of the pattern changed by irradiating the sample with the electron beam in accordance with a shape of the pattern,
wherein the contour of the pattern before irradiating the sample with the electron beam is calculated by calculating respectively individual shape change amounts of a two-dimensional pattern at specific portions, and
wherein the contour of the pattern before irradiating the sample with the electron beam is calculated based on the shape change amount calculated by the restoring calculation portion.

4. A scanning electron microscope comprising:
an electron source;
a convergent lens of converging an electron beam emitted from the electron source;
a deflection coil of scanning the electron beam on a sample;
a detector of detecting a secondary electron generated from the sample by irradiating the sample with the electron beam; and
calculating means for calculating a contour of a pattern of a surface of the sample based on an output of the detector;
wherein the calculating means corrects a contour of the pattern changed by irradiating the sample with the electron beam in accordance with a shape of the pattern;
wherein the contour of the pattern before irradiating the sample with the electron beam is calculated by calculating respectively individual shape change amounts at specific portions of a two-dimensional pattern;
a stress calculating portion of calculating a stress by which the specific portions of the pattern effect influences to each other,
wherein a position before irradiating the sample with the electron beam is calculated by using the stress calculating portion.

5. A scanning electron microscope comprising:
an electron source;
a convergent lens of converging an electron beam emitted from the electron source;
a deflection coil of scanning the electron beam on a sample;
a detector of detecting a secondary electron generated from the sample by irradiating the sample with the electron beam; and
calculating means for calculating a contour of a pattern of a surface of the sample based on an output of the detector, further comprising:
a shape storing portion of storing a shape parameter of the pattern of the sample observed previously;
a corresponding diagram storing portion of storing a correspondence of the shape parameter and a size change amount by changing a dimension by irradiating the sample with the electron beam; and
a restoring calculation portion of calculating a shape change amount by irradiating the sample with the electron beam from the shape storing portion and the corresponding diagram storing portion,
wherein the calculating means corrects the contour of the pattern before irradiating the sample with the electron beam based on the shape change amount calculated by the restoring calculation portion, wherein the shape of the pattern is an angle of a pattern edge relative to a scanning direction of the electron beam, further comprising:

a corresponding table storing portion of storing a corresponding diagram of the angle of the pattern edge relative to the scanning direction of the electron beam and the size change amount of the pattern.

6. A scanning electron microscope comprising:

an electron source;

a convergent lens of converging an electron beam emitted from the electron source;

a deflection coil of scanning the electron beam on a sample;

a detector of detecting a secondary electron generated from the sample by irradiating the sample with the electron beam; and calculating means for calculating a contour of a pattern of a surface of the sample based on an output of the detector; further comprising:

a shape storing portion of storing a shape parameter of the pattern of the sample observed previously;

a corresponding diagram storing portion of storing a correspondence of the shape parameter and a size change amount by changing a dimension by irradiating the sample with the electron beam; and a restoring calculation portion of calculating a shape change amount by irradiating the sample with the electron beam from the shape storing portion and the corresponding diagram storing portion, a stress calculating portion of calculating a stress by which a specific portions of the pattern effect influences to each other, wherein the calculating means corrects the contour of the pattern before irradiating the sample with the electron beam based on the shape change amount calculated by the restoring calculation portion, and calculates by using the stress calculating portion, wherein the shape of the pattern is a cross sectional shape of the pattern created at the sample, or wherein the shape of the pattern is a taper angle of a section of the pattern created at the sample.

7. A scanning electron microscope comprising:

an electron source;

a convergent lens of converging an electron beam emitted from the electron source;

a deflection coil of scanning the electron beam on a sample;

a detector of detecting a secondary electron generated from the sample by irradiating the sample with the electron beam;

calculating means for calculating a contour of a pattern of a surface of the sample based on an output of the detector;

a shape storing portion of storing a shape parameter of the pattern of the sample observed previously;

a corresponding diagram storing portion of storing a correspondence of the shape parameter and a size change amount by changing a dimension by irradiating the sample with the electron beam;

a restoring calculation portion of calculating a shape change amount by irradiating the sample with the electron beam from the shape storing portion and the corresponding diagram storing portion; and a restoring calculation portion of calculating the shape change amount by irradiating the sample with the electron beam by using a taper angle of a section of the pattern, the size change amount of the pattern, and a corresponding diagram storing portion of storing a corresponding diagram of an angle of a pattern edge relative to the scanning direction of the electron beam and the size change amount of the pattern when a restoring parameter amount of the specific portion of the two-dimensional pattern is made to be the size change amount, wherein the calculating means corrects the contour of the pattern before irradiating the sample with the electron beam based on the shape change amount calculated by the restoring calculation portion, wherein a contour of the pattern before irradiating the sample with the electron beam is calculated by calculating the respectively individual shape change amounts at specific portions of a two-dimensional pattern, and wherein the contour of the pattern before irradiating the sample with the electron beam is calculated based on the shape change amount calculated by the restoring calculation portion.

8. A scanning electron microscope comprising:

an electron source;

a convergent lens of converging an electron beam emitted from the electron source;

a deflection coil of scanning the electron beam on a sample;

a detector of detecting a secondary electron generated from the sample by irradiating the sample with the electron beam; and calculating means for calculating a contour of a pattern of a surface of the sample based on an output of the detector; further comprising:

a shape storing portion of storing a shape parameter of the pattern of the sample observed previously;

a corresponding diagram storing portion of storing a correspondence of the shape parameter and a size change amount by changing a dimension by irradiating the sample with the electron beam; and a restoring calculation portion of calculating a shape change amount by irradiating the sample with the electron beam from the shape storing portion and the corresponding diagram storing portion, wherein the calculating means corrects the contour of the pattern before irradiating the sample with the electron beam based on the shape change amount calculated by the restoring calculation portion;

wherein a contour of the pattern before irradiating the sample with the electron beam is calculated by calculating respectively individual shape change amounts at specific portions of a two-dimensional pattern;

a stress calculating portion of calculating a stress by which the specific portions of the pattern effect influences to each other, wherein a position before irradiating the sample with the electron beam is calculated by using the stress calculating portion.

* * * * *